(12) United States Patent
Tomimatsu et al.

(10) Patent No.: US 12,057,422 B2
(45) Date of Patent: Aug. 6, 2024

(54) SEMICONDUCTOR DEVICE AND MANUFACTURING METHOD THEREOF

(71) Applicant: Kioxia Corporation, Tokyo (JP)

(72) Inventors: Takahiro Tomimatsu, Nagoya Aichi (JP); Shinya Arai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/145,979

(22) Filed: Dec. 23, 2022

(65) Prior Publication Data

US 2023/0129339 A1 Apr. 27, 2023

Related U.S. Application Data

(63) Continuation of application No. 17/190,006, filed on Mar. 2, 2021, now Pat. No. 11,562,976.

(30) Foreign Application Priority Data

Sep. 17, 2020 (JP) ................. 2020-156645

(51) Int. Cl.
| | |
|---|---|
| *H01L 25/065* | (2023.01) |
| *H01L 23/00* | (2006.01) |
| *H01L 23/535* | (2006.01) |
| *H01L 25/00* | (2006.01) |
| *H01L 25/18* | (2023.01) |

(52) U.S. Cl.
CPC ............ *H01L 24/08* (2013.01); *H01L 23/535* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ....... H01L 24/08; H01L 23/535; H01L 24/80; H01L 25/0657; H01L 2224/08145; H01L 2224/80895; H01L 2224/80896; H01L 2924/1431; H01L 2924/14511; H01L 2224/02372; H01L 4/09; H01L 2224/04042; H01L 2225/0651; H01L 2225/06517; H10B 43/40
See application file for complete search history.

(56) References Cited

U.S. PATENT DOCUMENTS

| | | | |
|---|---|---|---|
| 2020/0286842 A1* | 9/2020 | Sanuki | ............ H01L 25/50 |
| 2020/0286990 A1 | 9/2020 | Uchiyama et al. | |
| 2020/0295037 A1 | 9/2020 | Iijima et al. | |
| 2021/0233900 A1 | 7/2021 | Kim et al. | |
| 2021/0375790 A1 | 12/2021 | Oda et al. | |

FOREIGN PATENT DOCUMENTS

| | | |
|---|---|---|
| JP | 2010-129686 A | 6/2010 |
| TW | 202034493 A | 9/2020 |

* cited by examiner

*Primary Examiner* — Thanh Y. Tran
(74) *Attorney, Agent, or Firm* — Foley & Lardner LLP

(57) ABSTRACT

According to one embodiment, a semiconductor device includes a first substrate; a first insulating film provided on the first substrate; a first plug provided in the first insulating film; a second substrate provided on the first insulating film; and a first wiring including a first portion and a second portion. The first portion is provided in the second substrate and coupled to the first plug, and the second portion is provided on the second substrate and coupled to a bonding pad.

5 Claims, 9 Drawing Sheets

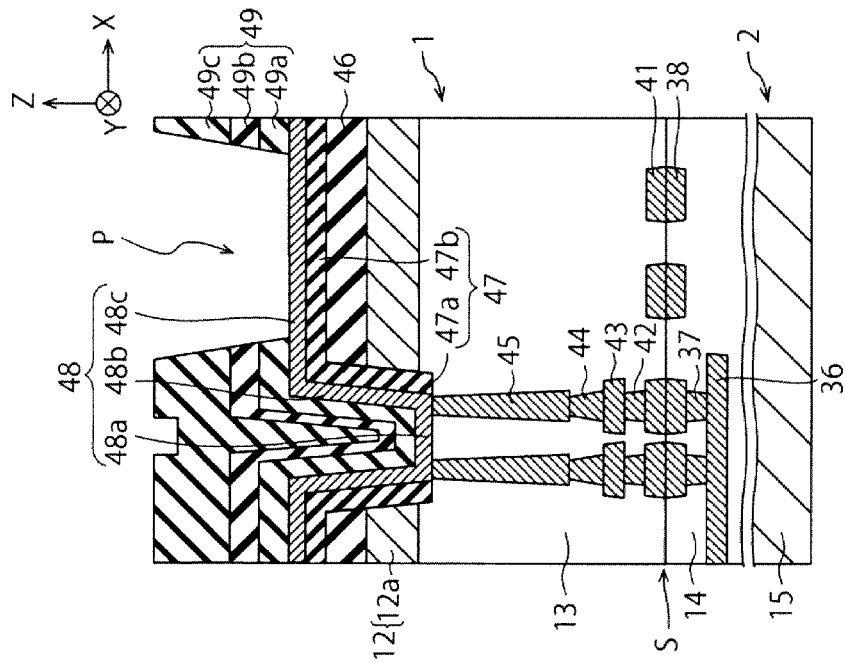
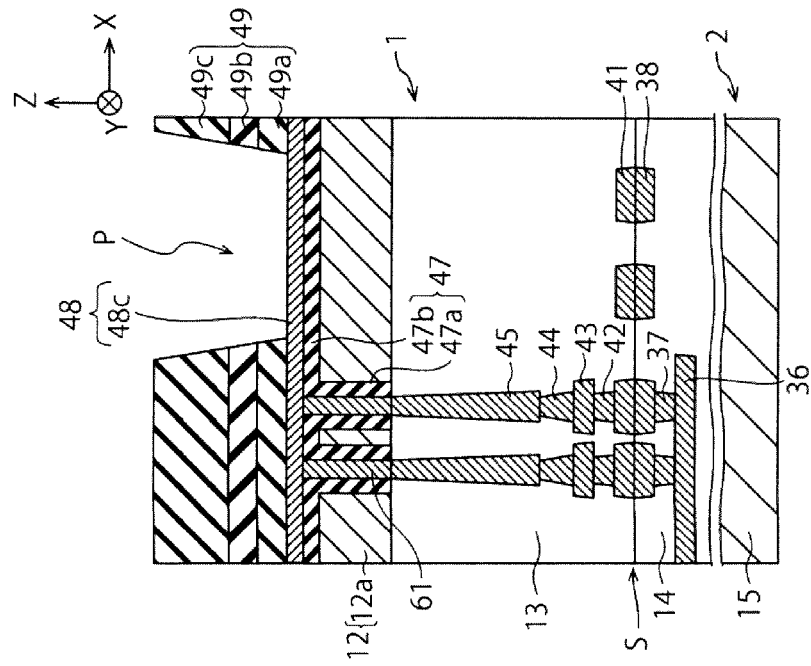

SEMICONDUCTOR DEVICE AND MANUFACTURING METHOD THEREOF

CROSS-REFERENCE TO RELATED APPLICATION

This application is a continuation application of U.S. patent application Ser. No. 17/190,006, filed Mar. 2, 2021, which is based upon and claims the benefit of priority from Japanese Patent Application No. 2020-156645, filed Sep. 17, 2020, the entire contents of which are incorporated herein by reference.

FIELD

Embodiments described herein relate generally to a semiconductor device and a manufacturing method thereof.

BACKGROUND

When a via plug and a bonding pad are formed on a substrate, it is desirable to electrically connect the bonding pad to the via plug in a suitable form.

Examples of related art include JP-A-2010-129686.

DESCRIPTION OF THE DRAWINGS

FIGS. 3A and 3B are cross-sectional views for comparing the semiconductor device in the embodiment with a semiconductor device in a comparative example.

DETAILED DESCRIPTION

Embodiments provide a semiconductor device and a manufacturing method thereof, in which it is possible to electrically connect a bonding pad to a via plug in a suitable form.

In general, according to one embodiment, a semiconductor device includes a first substrate; a first insulating film provided on the first substrate; a first plug provided in the first insulating film; a second substrate provided on the first insulating film; and a first wiring including a first portion and a second portion. The first portion is provided in the second substrate and coupled to the first plug, and the second portion is provided on the second substrate and coupled to a bonding pad.

Hereinafter, an embodiment of the present disclosure will be described with reference to the drawings. In FIGS. 1 to 9B, the same components are denoted by the same reference signs, and repetitive description will be omitted.

Embodiment

Figure 1:
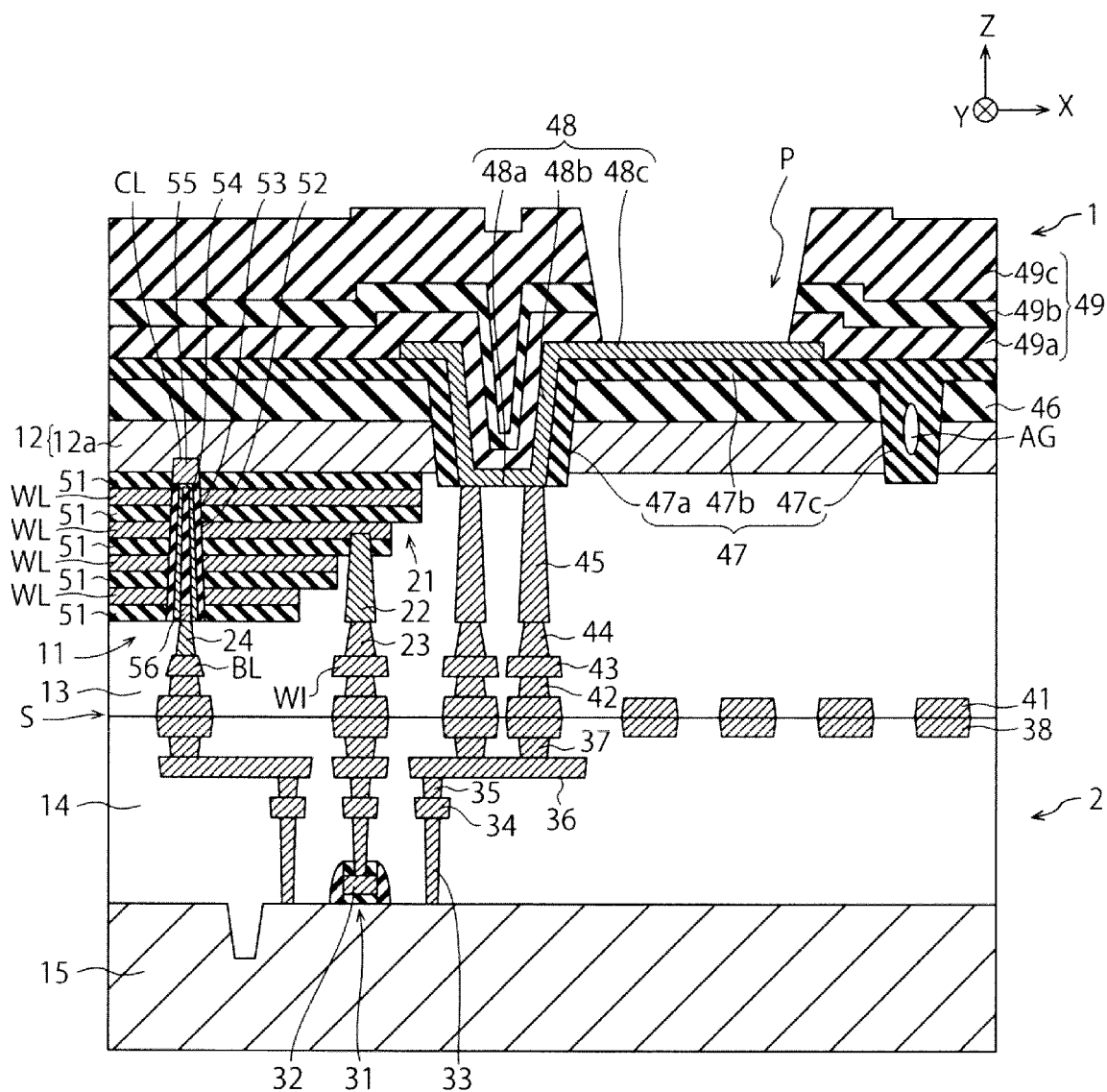
FIG. 1 is a cross-sectional view illustrating a structure of a semiconductor device according to an embodiment.

FIG. 1 is a cross-sectional view illustrating a structure of a semiconductor device according to an embodiment. The semiconductor device in FIG. 1 is a three-dimensional memory in which an array chip 1 and a circuit chip 2 are bonded to each other.

FIG. 1 illustrates an X-direction, a Y-direction, and a Z-direction which are perpendicular to each other. In this specification, the +Z direction is handled as an upward direction, and the −Z direction is handled as a downward direction. The −Z direction may or may not coincide with the direction of gravity.

The array chip 1 includes a memory cell array 11 including a plurality of memory cells, a substrate 12 on the memory cell array 11, and an interlayer insulating film 13 under the memory cell array 11. For example, the substrate 12 is a semiconductor substrate such as a silicon substrate. FIG. 1 illustrates a well region 12a formed in the substrate 12. For example, the interlayer insulating film 13 is a silicon oxide film or a stacked film including a silicon oxide film and another insulating film. The substrate 12 is an example of the second substrate. The interlayer insulating film 13 is an example of the first insulating film.

The circuit chip 2 is provided below the array chip 1. FIG. 1 illustrates a bonding surface S between the array chip 1 and the circuit chip 2. The circuit chip 2 includes an interlayer insulating film 14 and a substrate 15 under the interlayer insulating film 14. For example, the interlayer insulating film 14 is a silicon oxide film or a stacked film including a silicon oxide film and another insulating film. For example, the substrate 15 is a semiconductor substrate such as a silicon substrate. The interlayer insulating film 14 is an example of the first insulating film together with the interlayer insulating film 13. The substrate 15 is an example of the first substrate.

The array chip 1 includes a plurality of word lines WL as an electrode layer in the memory cell array 11. FIG. 1 illustrates a staircase structure portion 21 in the memory cell array 11. Each of the word lines WL is electrically connected to a word interconnection layer WL via a contact plug 22 and a via plug 23. FIG. 1 further illustrates one of a plurality of columnar portions CL penetrating the plurality of word lines WL. Each of the columnar portions CL is electrically connected to a bit line BL via a via plug 24.

The circuit chip 2 includes a plurality of transistors 31. FIG. 1 illustrates one of the transistors 31. Each of the transistor 31 includes a gate electrode 32 provided on the substrate 15 via a gate insulating film, and a source diffusion layer and a drain diffusion layer (not illustrated) provided in the substrate 15. The circuit chip 2 includes a plurality of contact plugs 33, a wiring layer 34, and a plurality of via plugs 35. The contact plug is provided on the gate electrode 32, the source diffusion layer, or the drain diffusion layer of the transistor 31. The wiring layer is provided on the contact plugs 33 and includes a plurality of wirings. The via plugs are provided on the wiring layer 34.

The circuit chip 2 further includes a wiring layer 36 that is provided on the via plugs 35 and includes a plurality of wirings, a plurality of a via plugs 37 provided on the wiring layer 36, and a plurality of metal pads 38 provided on the via plugs 37. The metal pad 38 is, for example, a metal layer including a Cu layer or an Al layer (Cu represents copper and Al represents aluminum). The circuit chip 2 functions as a control circuit (logic circuit) that controls the operation of the array chip 1. The control circuit includes the transistor 31 and the like, and is electrically connected to the metal pad 38.

The array chip 1 includes a plurality of metal pads 41 provided on the metal pads 38, and a plurality of via plugs 42 provided on the metal pads 41. The array chip 1 includes a wiring layer 43 that is provided on the via plugs 42 and includes a plurality of wirings, and a plurality of via plugs 44 provided on the wiring layer 43. The metal pad 41 is, for example, a metal layer including a Cu layer or an Al layer. The bit line BL and word interconnection layer WI described above are provided in the wiring layer 43. The above-described control circuit is electrically connected to the memory cell array 11 via the metal pads 41, 38 and the like, and controls the operation of the memory cell array 11 via the metal pads 41, 38 and the like.

The array chip 1 further includes a plurality of via plugs 45 provided on the plurality of via plugs 44. FIG. 1 illustrates two of the via plugs 45. The via plug 45 is provided in the interlayer insulating film 13 and is provided on the side of the memory cell array 11. The via plug 45 is, for example, a metal layer including a tungsten (W) layer. The via plug 45 is an example of the first plug.

The array chip 1 further includes an insulating film 46, an insulating film 47, and a metal wiring 48, which are sequentially formed on the substrate 12. The insulating film 46 is, for example, a silicon oxide film. The insulating film 47 is, for example, a silicon oxide film. The metal wiring 48 is, for example, a metal layer including an Al layer. The insulating film 46 is an example of the second insulating film or a first film. The insulating film 47 is an example of the second insulating film or a second film. The metal wiring 48 is an example of the first wiring.

The insulating film 47 includes a side portion 47a formed on the side surface of the substrate 12 and the insulating film 46, an upper portion 47b formed on the upper surface of the insulating film 46, and a buried portion 47c buried in the substrate 12 and the insulating film 46. The side portion 47a and the buried portion 47c are formed in the substrate 12 and the insulating film 46. The upper portion 47b is formed outside the substrate 12 and the insulating film 46. In the embodiment, the side portion 47a functions as a side wall insulating film on the side surface of the substrate 12 and the insulating film 46. The buried portion 47c functions as a device isolation insulating film in the substrate 12 and the insulating film 46. In the embodiment, the buried portion 47c includes an air gap AG formed when the buried portion 47 is buried in the substrate 12 and the insulating film 46. The side portion 47a is an example of a third portion. The buried portion 47c is an example of a fourth portion different from the third portion.

The metal wiring 48 includes an upper portion 48a formed on the upper surface of the interlayer insulating film 13 and the plurality of via plugs 45, a side portion 48b formed on the side surface of the insulating film 47, and an upper portion 48c formed on the upper surface of the insulating film 47. The metal wiring 48 is electrically connected to the plurality of via plugs 45. The upper portion 48a and the side portion 48b are formed in the substrate 12, the insulating film 46, and the insulating film 47. The upper portion 48c is formed outside the substrate 12, the insulating film 46, and the insulating film 47. In the embodiment, the upper portion 48a, the side portion 48b, and the upper portion 48c are simultaneously formed by the same wiring layer. Thus, the upper portion 48a, the side portion 48b, and the upper portion 48c are formed of the same material (for example, aluminum). In the embodiment, the upper portion 48a, the side portion 48b, and the upper portion 48c form one continuous wiring. The upper portion 48a and the side portion 48b are examples of the first portion. The upper portion 48c is an example of the second portion.

The array chip 1 further includes an insulating film 47 and a passivation film 49 formed on the metal wiring 48. The passivation film 49 is an example of a third insulating film.

The passivation film 49 includes an insulating film 49a, an insulating film 49b, and an insulating film 49c, which are sequentially formed on the insulating film 47 and the metal wiring 48. The insulating film 49a is, for example, a silicon oxide film. The insulating film 49b is, for example, a silicon nitride film. The insulating film 49c is, for example, a polyimide film. In the embodiment, as illustrated in FIG. 1, the passivation film 49 includes a portion that is formed in the substrate 12 and the insulating film 46 via the insulating film 47 (side portion 47a) and the metal wiring 48 (side portion 48a).

The passivation film 49 includes, for example, an opening P that exposes the upper surface of the upper portion 48c of the metal wiring 48. The upper portion 48c exposed in the opening P functions as an external connection pad (bonding pad) of the semiconductor device in FIG. 1. The upper portion 48c may be connected to a mounting substrate or other devices by a bonding wire, a solder ball, a metal bump, and the like via the opening P.

In the embodiment, the metal wiring 48 includes an upper portion 48a provided on the plurality of via plugs 45 and the upper portion 48c including a bonding pad. The metal wiring functions as a connection wiring for electrically connecting the via plugs 45 with the bonding pad. The number of via plugs 45 electrically connected to the one metal wiring 48 may be freely set, and is, for example, 100 to 10000.

The memory cell array 11 in the array chip 1 includes a plurality of insulating layers 51 alternately stacked with the plurality of word lines WLs. The insulating layer 51 is, for example, a silicon oxide film.

Each of the columnar portions CL in the array chip 1 includes a memory insulating film 52, a channel semiconductor layer 53, a core insulating film 54, a semiconductor layer 55, and a semiconductor layer 56. The memory insulating film 52, the channel semiconductor layer 53, and the core insulating film 54 are sequentially formed in the word line WL and the insulating layer 51. The semiconductor layer 55 is formed on the channel semiconductor layer 53, and electrically connects the channel semiconductor layer 53 and the substrate 12 with each other. The semiconductor layer 56 is formed on the side surface of the channel semiconductor layer 53 under the core insulating film 54, and electrically connects the channel semiconductor layer 53 and the via plug 24 with each other.

Figure 2:
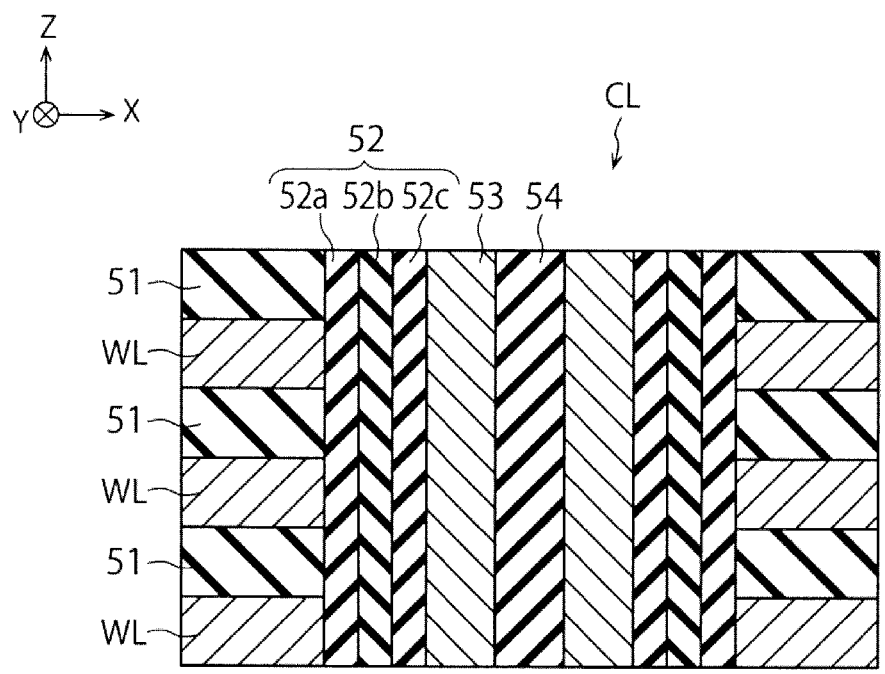
FIG. 2 is a cross-sectional view illustrating a structure of each columnar portion in the embodiment.

FIG. 2 is a cross-sectional view illustrating the structure of each columnar portion CL in the embodiment. FIG. 2 corresponds to an enlarged view of the cross-sectional view in FIG. 1.

As illustrated in FIG. 2, the memory insulating film 52 includes a block insulating film 52a, a charge storage layer 52b, and a tunnel insulating film 52c, which are sequentially formed in the word line WL and the insulating layer 51. The block insulating film 52a, the tunnel insulating film 52c, and the core insulating film 54 are, for example, a silicon oxide film or a metal insulating film. The charge storage layer 52b is, for example, a silicon nitride film. The charge storage layer 52b may be a semiconductor layer such as a polycrystalline silicon layer. The channel semiconductor layer 53, the semiconductor layer 55 (FIG. 1), and the semiconductor layer 56 (FIG. 1) are, for example, a polycrystalline silicon layer or a single crystal silicon layer.

FIGS. 3A and 3B are cross-sectional views for comparing the semiconductor device in the embodiment with a semiconductor device in a comparative example.

FIG. 3A illustrates the structure of the semiconductor device in the comparative example. The semiconductor device in the comparative example has substantially the same structure as the semiconductor device in the embodiment. However, in the comparative example, a plurality of via plugs 61 are formed on the plurality of via plugs 45, and the upper portion 48c of the metal wiring 48 is formed on the via plugs 61. In the comparative example, the metal wiring 48 does not include the upper portion 48a and the side portion 48b.

The via plug 61 and the metal wiring 48 illustrated in FIG. 3A are formed as follows, for example. Firstly, a plurality of via holes are formed in the substrate 12, and the plurality of via plugs 45 are exposed in the via holes. Then, the via plugs 61 are formed in the via holes via the insulating film 47, and thus the via plug 61 is disposed on the via plug 45. Then, the metal wiring 48 is formed on the via plug 61.

FIG. 3B illustrates the structure of the semiconductor device in the embodiment. The metal wiring 48 illustrated in FIG. 3B is formed as follows, for example. Firstly, one opening is formed in the substrate 12, and a plurality of via plugs 45 are exposed in the opening. Then, the metal wiring 48 is formed over the inside and the outside of the opening, and the metal wiring 48 is formed on the via plug 45.

In the comparative example, in order to electrically connect the bonding pad (upper portion 48c of the metal wiring 48) to the via plug 45, it is necessary to perform a step of forming the via hole, a step of forming the via plug 61, and a step of forming the metal wiring 48. On the other hand, according to the embodiment, it is possible to electrically connect the bonding pad (upper portion 48c of the metal wiring 48) to the via plug 45 by performing the step of forming the opening and the step of forming the metal wiring 48. As described above, according to the embodiment, it is possible to omit the step of forming the via plug 61, and thus to reduce the number of manufacturing steps and the manufacturing cost of the semiconductor device.

The via hole in the comparative example has a high aspect ratio, but the opening in the embodiment has a low aspect ratio. Thus, according to the embodiment, it is possible to simultaneously form the opening and a device isolation groove in the substrate 12, and thus to more reduce the number of manufacturing steps and the manufacturing cost of the semiconductor device.

In the embodiment, the device isolation insulating film (buried portion 47c of the insulating film 47) is buried in the device isolation groove. According to the embodiment, it is possible to simultaneously form the device isolation insulating film and the side wall insulating film (side portion 47a of the insulating film 47) on the side surface of the opening, and thus to more reduce the number of manufacturing steps and the manufacturing cost of the semiconductor device.

In addition, the metal wiring 48 in the comparative example is electrically connected to the via plug 45 via the via plug 61. However, the metal wiring 48 in the embodiment is electrically connected to the via plug 45 without passing through another layer. Thus, according to the embodiment, it is possible to reduce the electric resistance between the via plug 45 and the metal wiring 48, and thus to reduce the electric resistance between the via plug 45 and the bonding pad.

FIGS. 4A to 9B are cross-sectional views illustrating a manufacturing method of the semiconductor device in the embodiment. As will be described later, the semiconductor device in the embodiment is manufactured by bonding an array wafer W1 including a plurality of array chips 1 and a circuit wafer W2 including a plurality of circuit chips 2 to each other.

Figure 4A:
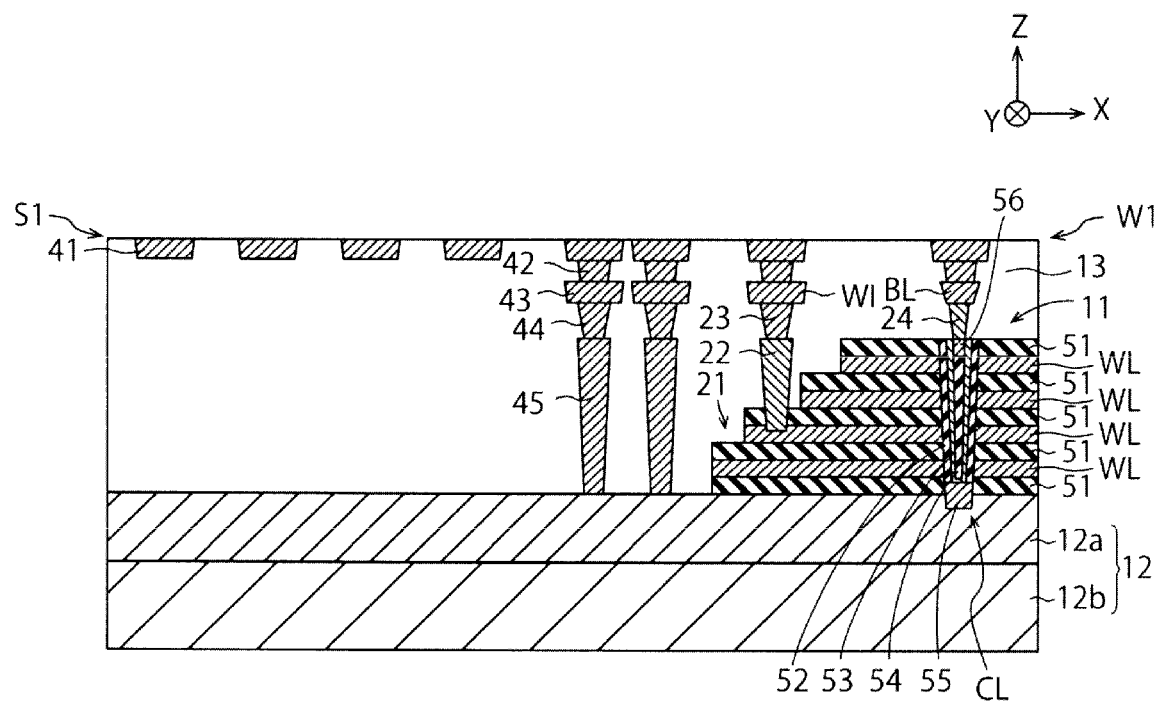
FIGS. 4A and 4B are cross-sectional views (1/6) illustrating a manufacturing method of the semiconductor device in the embodiment.

Firstly, a substrate 12 is prepared, and a well region 12a is formed in the substrate 12 (FIG. 4A). FIG. 4A illustrates the well region 12a and other regions 12b in the substrate 12. Then, a memory cell array 11, an interlayer insulating film 13, a via plug 45, a via plug 44, a wiring layer 43, a via plug 42, a metal pad 41, and the like are formed on the substrate 12 (FIG. 4A). FIG. 4A further illustrates a word line WL, an insulating layer 51, a columnar portion CL, a staircase structure portion 21, and the like in the memory cell array 11. For example, a plurality of via plugs 45 are formed on the substrate 12 (well region 12a) in the interlayer insulating film 13. In this manner, the array wafer W1 is manufactured. FIG. 4A illustrates the upper surface S1 of the array wafer W1.

Figure 4B:
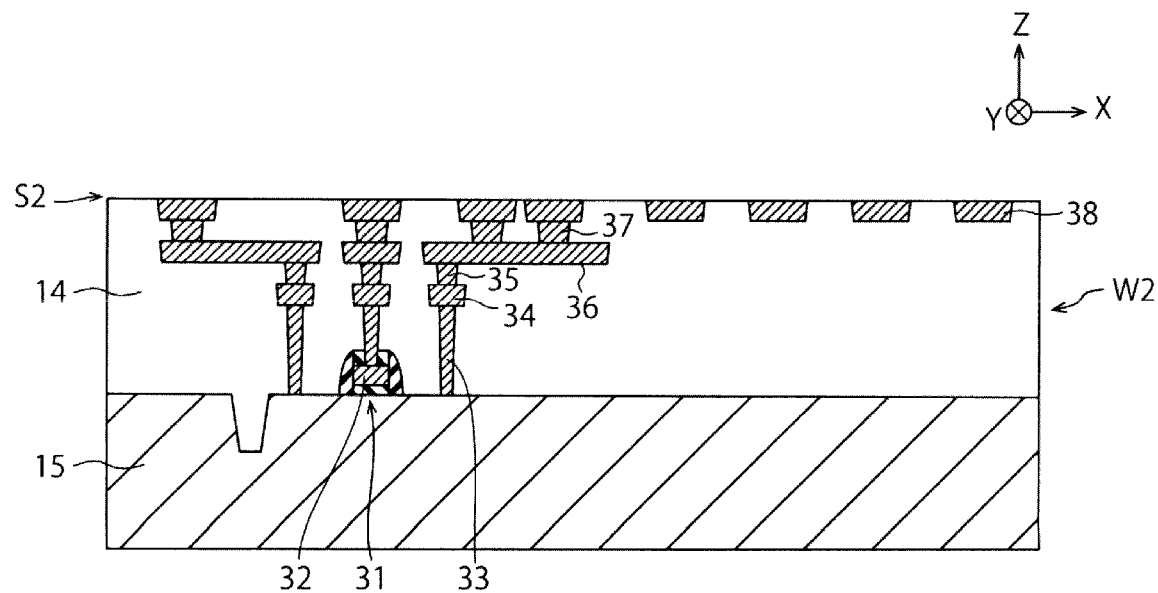

Then, a substrate 15 is prepared, and an interlayer insulating film 14, a transistor 31, a gate electrode 32, a contact plug 33, a wiring layer 34, a via plug 35, a wiring layer 36, a via plug 37, a metal pad 38, and the like are formed on the substrate 15 (FIG. 4B). In this manner, the circuit wafer W2 is manufactured. FIG. 4B illustrates the upper surface S2 of the circuit wafer W2.

Figure 5A:
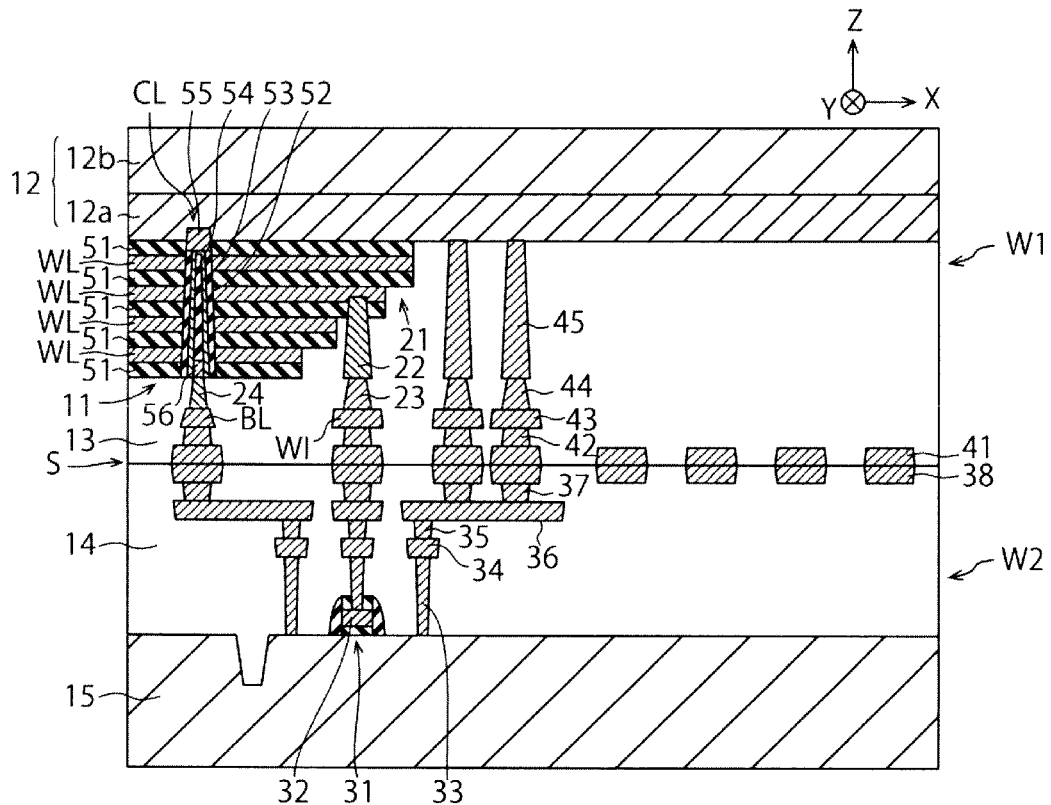
FIGS. 5A and 5B are cross-sectional views (2/6) illustrating the manufacturing method of the semiconductor device in the embodiment.

Then, the array wafer W1 and the circuit wafer W2 are bonded to each other (FIG. 5A). Specifically, the substrate 12 and the substrate 15 are bonded to each other via the memory cell array 11, the interlayer insulating film 13, the interlayer insulating film 14, the transistor 31, the via plug 45, and the like. In FIG. 5A, the array wafer W1 is bonded to the circuit wafer W2 by turning the array wafer W1 upside down. As a result, the substrate 12 is disposed above the substrate 15. In such a bonding step, the interlayer insulating film 13 and the interlayer insulating film 14 are bonded by mechanical pressure, and the metal pad 41 and the metal pad 38 are bonded by annealing.

Figure 5B:
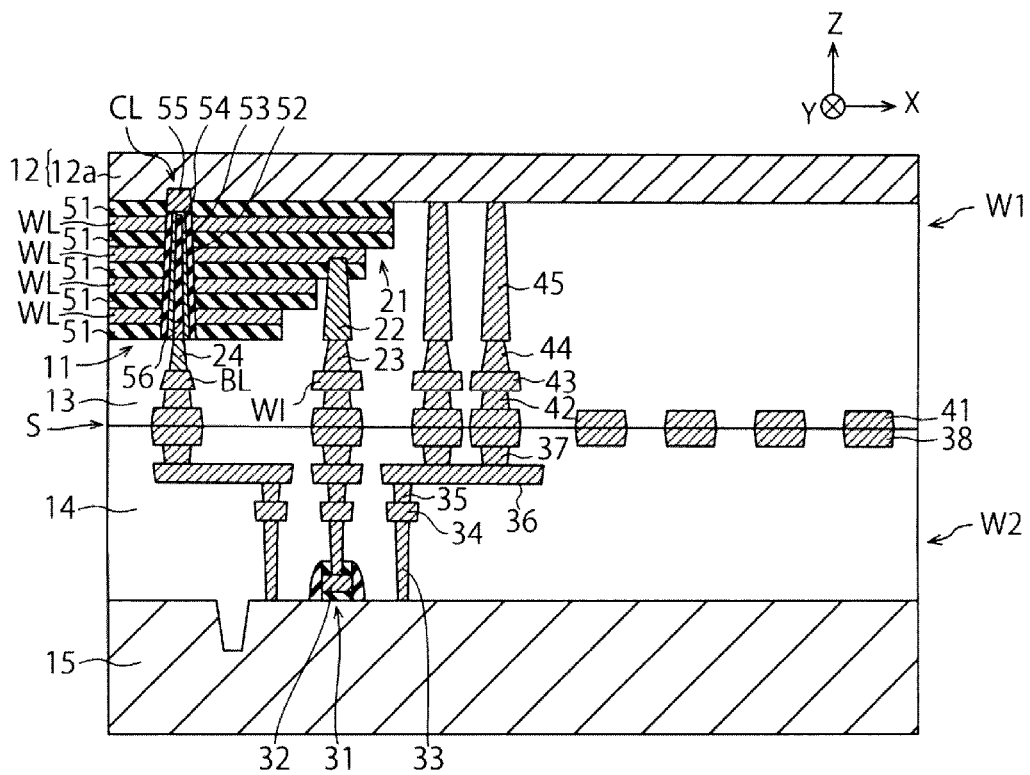

Then, the substrate 12 is thinned by wet etching (FIG. 5B). As a result, the thickness of the substrate 12 becomes thin. In FIG. 5B, the well region 12a in the substrate 12 remains after the thinning, and the other regions 12b in the substrate 12 are removed by the thinning.

Figure 6A:
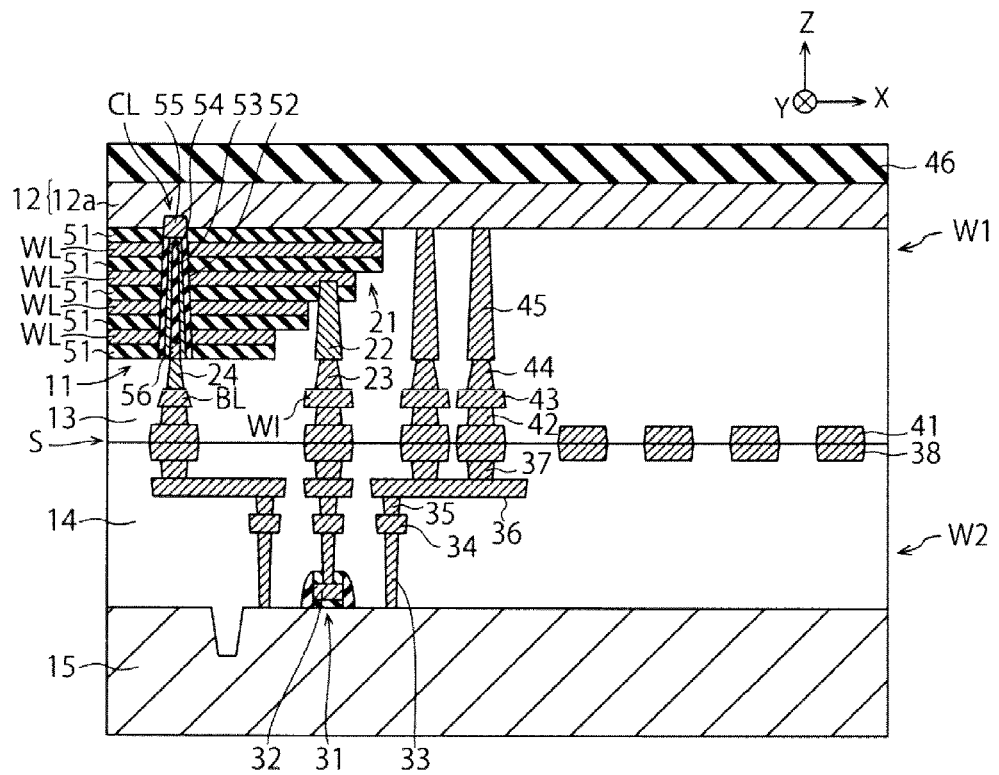
FIGS. 6A and 6B are cross-sectional views (3/6) illustrating the manufacturing method of the semiconductor device in the embodiment.
Figure 6B:
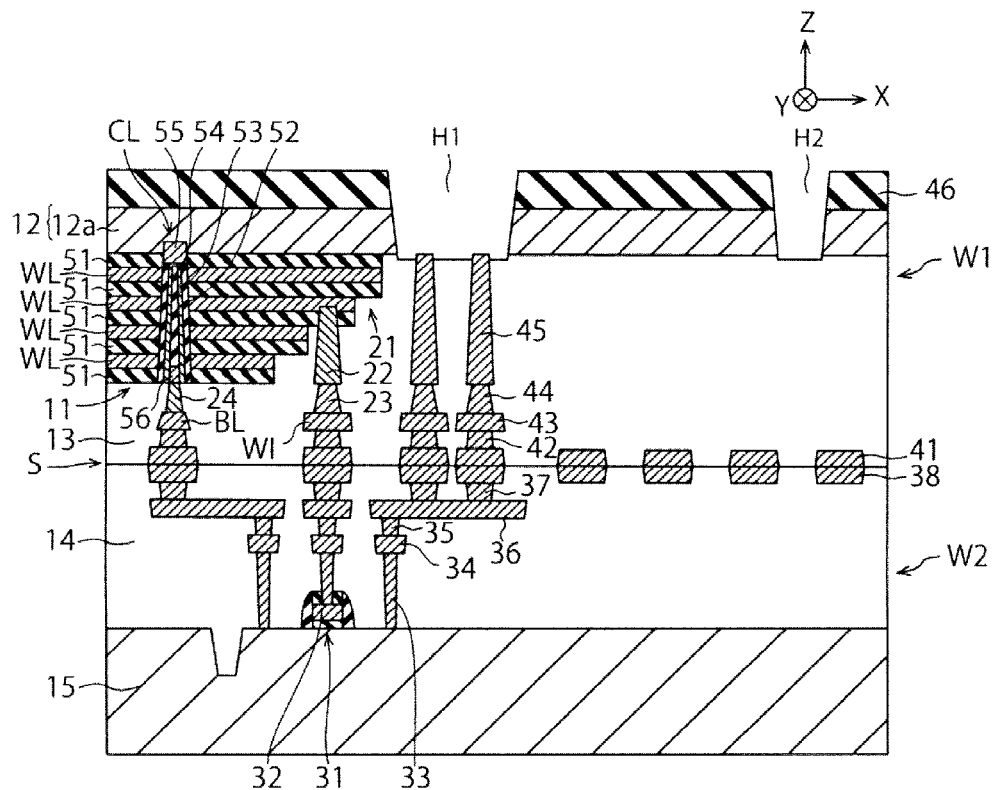

Then, the insulating film 46 is formed on the substrate 12 (FIG. 6A). Then, the insulating film 46 and the substrate 12 are etched by reactive ion etching (RIE) (FIG. 6B). As a result, an opening H1 is formed in the insulating film 46 and the substrate 12. The interlayer insulating film 13 and the plurality of via plugs 45 are exposed in the opening H1. An opening H2 is formed in the insulating film 46 and the substrate 12. The interlayer insulating film 13 is exposed in the opening H2. In the embodiment, the opening H2 is a device isolation groove. In the step of FIG. 6B, the opening H1 and the opening H2 are simultaneously formed by the RIE. The opening H1 is an example of a first opening. The opening H2 is an example of a second opening different from the first opening. The insulating film 46 is an example of the first film.

Figure 7A:
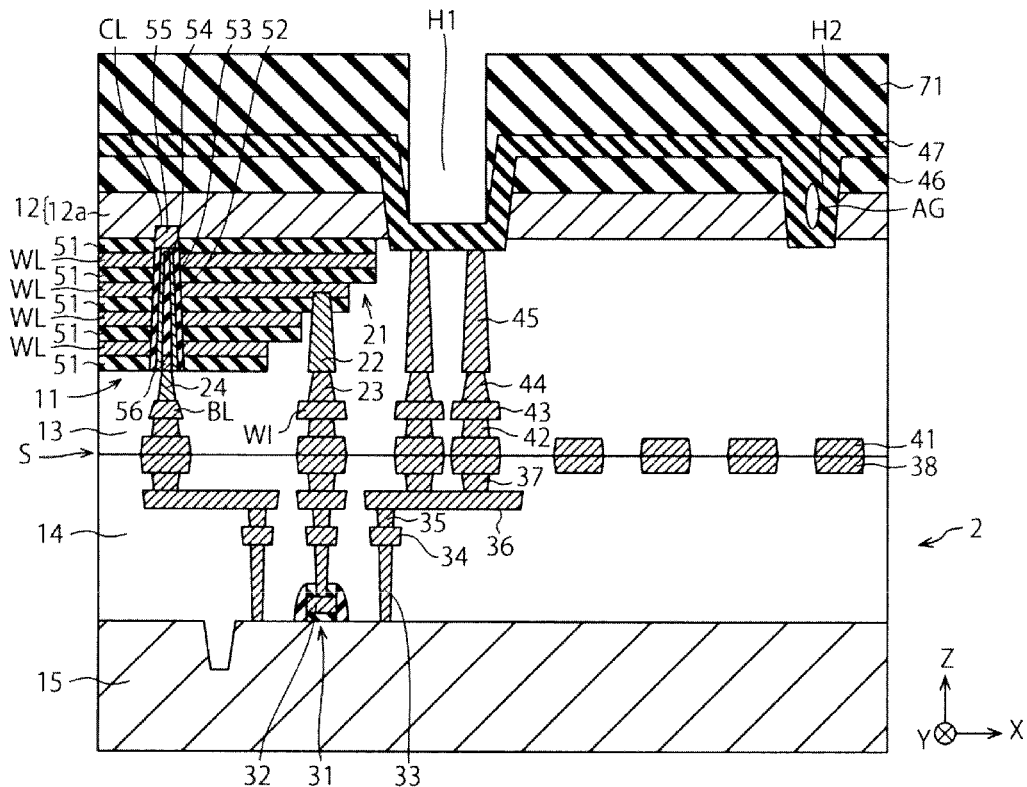
FIGS. 7A and 7B are cross-sectional views (4/6) illustrating the manufacturing method of the semiconductor device in the embodiment.

Then, the insulating film 47 is formed on the entire surface of the substrate 12 (FIG. 7A). As a result, the insulating film 47 is formed on the surfaces of the insulating film 46, the substrate 12, the interlayer insulating film 13, and the via plug 45. Specifically, the side surface and the bottom surface of the opening H1 are covered by the insulating film 47. The opening H2 is filled with the insulating film 47. In the embodiment, the air gap AG is formed in the insulating film 47 in the opening H2 in the step of FIG. 7A. Then, a resist layer 71 is formed on the entire surface of the substrate 12. The resist layer 71 is removed from the bottom surface of the opening H1 (FIG. 7A).

Figure 7B:
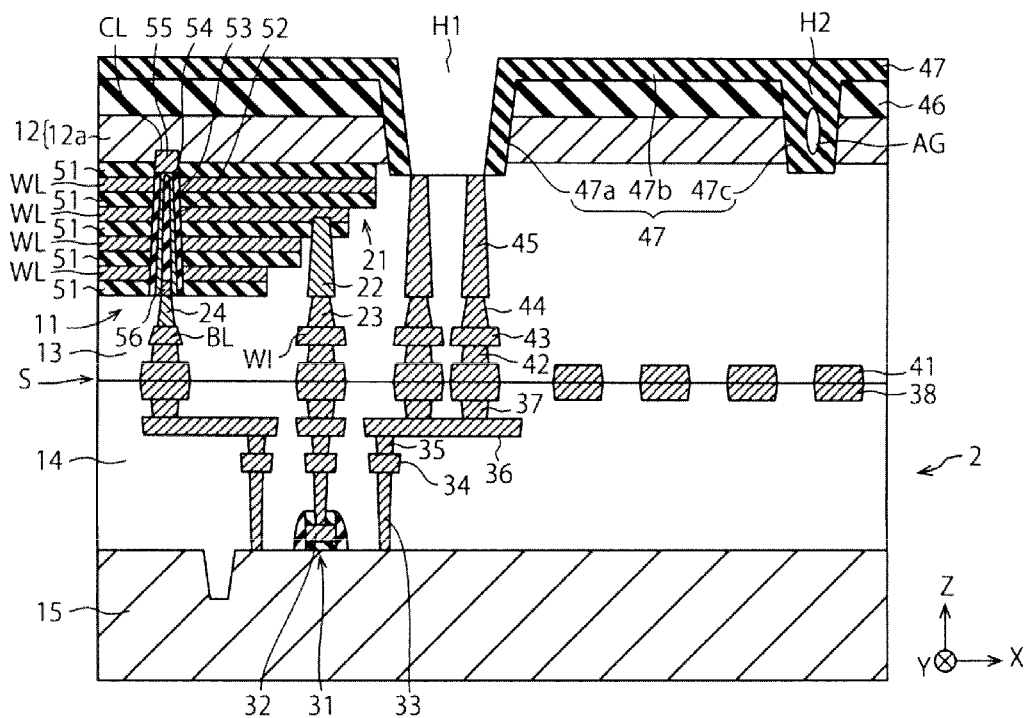

Then, the insulating film 47 is etched by RIE using the resist layer 71 as a mask (FIG. 7B). As a result, the insulating film 47 is removed from the bottom surface of the opening H1. The interlayer insulating film 13 and the plurality of via plugs 45 are exposed again in the opening H1. The insulating film 47 is processed into a shape including a side portion 47a on the side surface of the opening H1, an upper portion 47b on the upper surface of the insulating film 46, and a buried portion 47c in the opening H2. In the embodiment, the side portion 47a functions as a side wall insulating film, and the buried portion 47c functions as a device isolation insulating film. As described above, according to the embodiment, it is possible to simultaneously form the side wall insulating film and the device isolation insulating film. The insulating film 47 is an example of the second film.

Figure 8A:
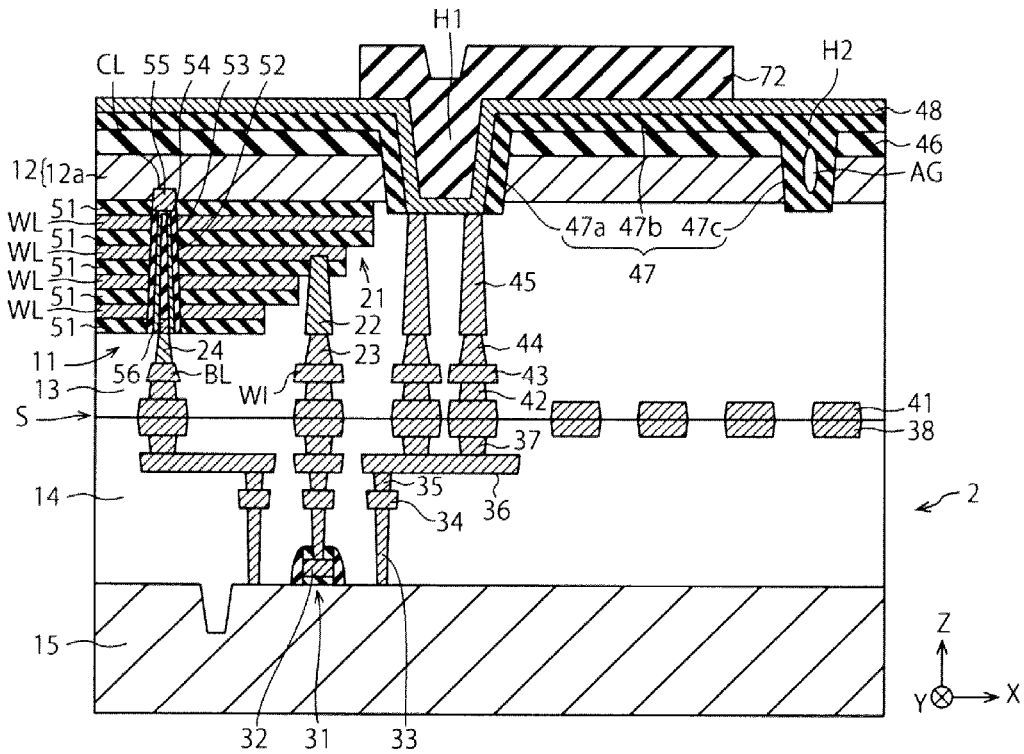
FIGS. 8A and 8B are cross-sectional views (5/6) illustrating the manufacturing method of the semiconductor device in the embodiment.

Then, a metal wiring layer 48 as a material for the metal wiring 48 is (e.g., conformally) formed over the surface of the substrate 12 (FIG. 8A). As a result, the metal wiring layer 48 is formed on the surfaces of the insulating film 47, the interlayer insulating film 13, and the via plug 45. Specifically, the side surface of the opening H1 is covered by the metal wiring layer 48 via the insulating film 47. The bottom surface of the opening H1 is covered by the metal wiring layer 48. The metal wiring layer 48 is, for example, a metal layer including an Al layer. Then, a resist layer 72 is formed on the entire surface of the substrate 12, and then a portion of the resist layer 72 is removed (FIG. 8A).

Figure 8B:
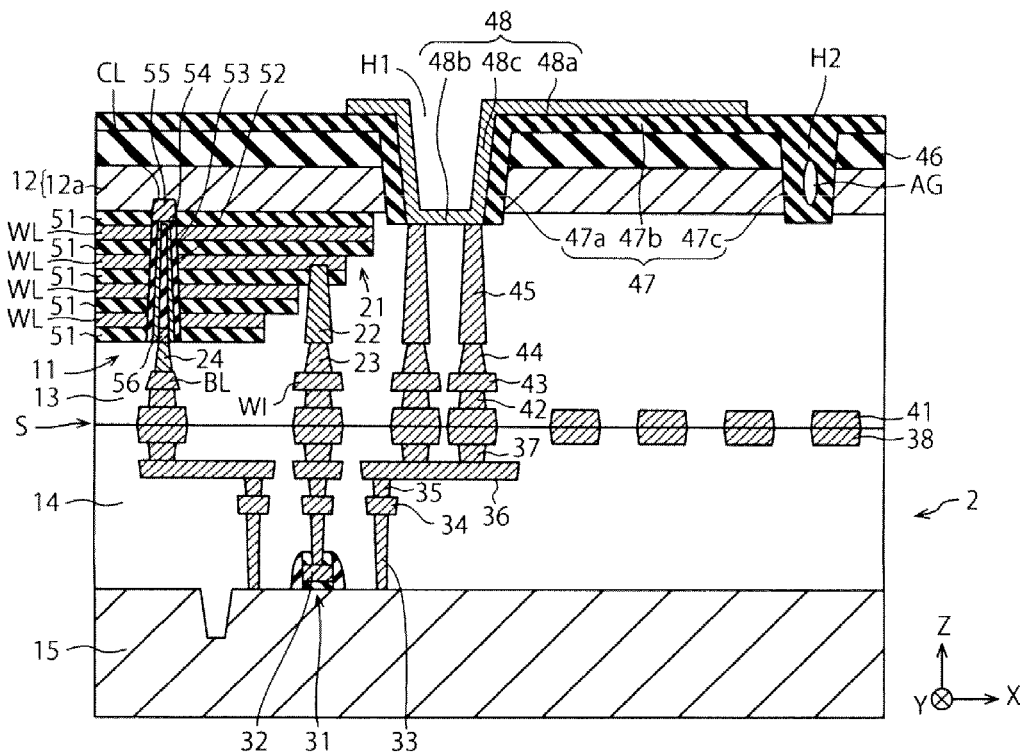

Then, the metal wiring layer 48 is etched by RIE using the resist layer 72 as a mask (FIG. 8B). As a result, the metal wiring layer 48 is processed into the metal wiring 48 including an upper portion 48a on the bottom surface of the opening H1, a side portion 48b on the side surface of the opening H1, and an upper portion 48c on the upper surface of the insulating film 47. Since the upper portion 48a is formed on the plurality of via plugs 45, the metal wiring 48 is electrically connected to the via plugs 45. In the embodiment, the upper portion 48a, the side portion 48b, and the upper portion 48c are simultaneously formed by the same metal wiring layer 48. Thus, the upper portion 48a, the side portion 48b, and the upper portion 48c are formed of the same material (for example, aluminum). In the embodiment, the upper portion 48a, the side portion 48b, and the upper portion 48c form one continuous wiring.

Figure 9A:
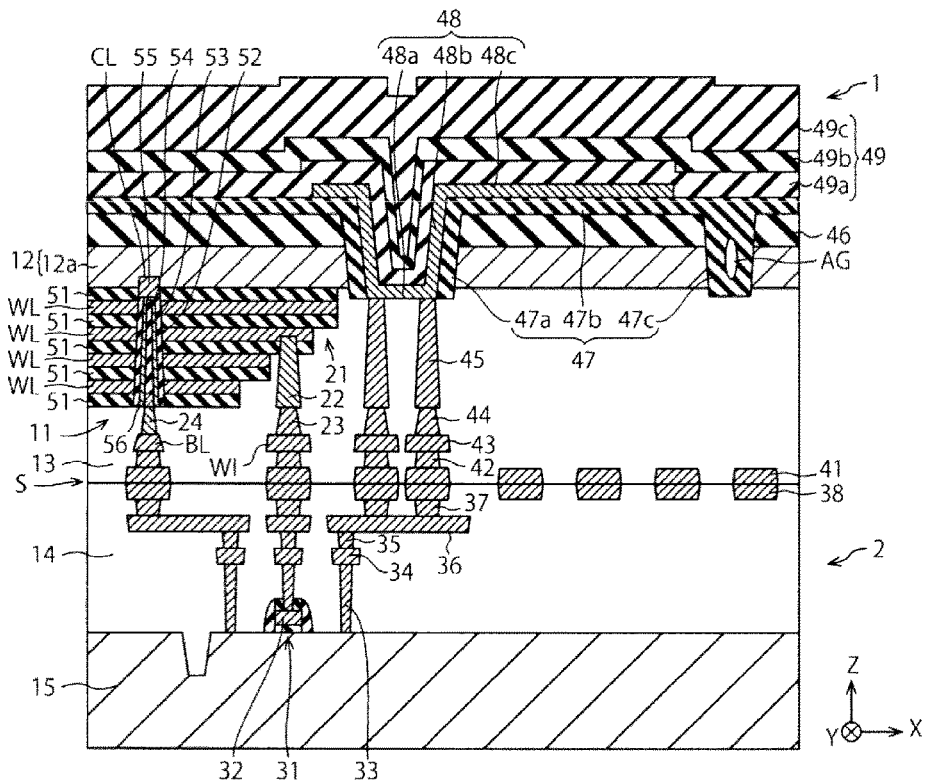
FIGS. 9A and 9B are cross-sectional views (6/6) illustrating the manufacturing method of the semiconductor device in the embodiment.

Then, insulating films 49a, 49b, and 49c of a passivation film 49 are sequentially formed on the entire surface of the substrate 12 (FIG. 9A). As a result, the passivation film 49 is formed on the surfaces of the insulating film 47 and the metal wiring 48. In the embodiment, the passivation film 49 includes a portion that is formed in the opening H1 via the insulating film 47 (side portion 47a) and the metal wiring 48 (side portion 48a).

Figure 9B:
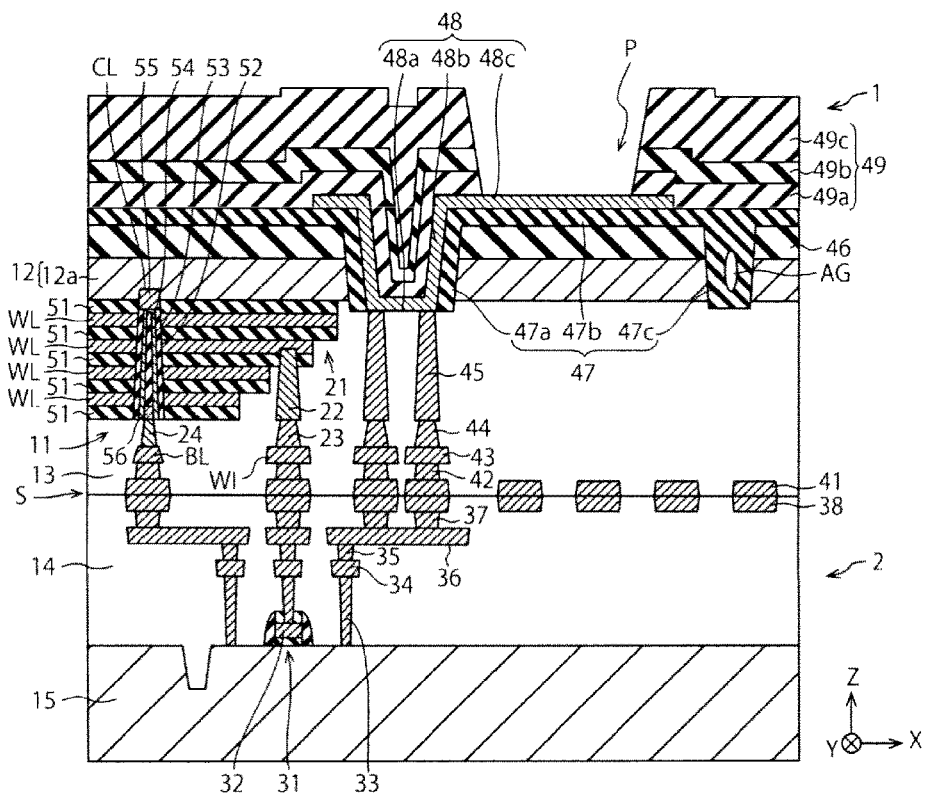

Then, a portion of the passivation film 49 on the upper surface of the upper portion 48c is removed (FIG. 9B). As a result, an opening P is formed in the passivation film 49, and the upper surface of the upper portion 48c is exposed in the opening P. The upper portion 48c exposed in the opening P functions as a bonding pad. Therefore, the metal wiring 48 in the embodiment includes both a portion in contact with the via plug 45 and a portion that functions as the bonding pad.

Then, the array wafer W1 and the circuit wafer W2 are cut into a plurality of chips by dicing. The chips are cut so that each chip includes one array chip 1 and one circuit chip 2. In this manner, the semiconductor device in FIG. 1 is manufactured.

As described above, the metal wiring 48 in the embodiment includes the upper portion 48a provided on the via plug 45 and the upper portion 48c including the bonding pad. Therefore, according to the embodiment, it is possible to electrically connect the bonding pad to the via plug 45 in a suitable form. For example, it is possible to electrically connect the bonding pad to the via plug 45 without using the via plug 61 as in the comparative example, and to reduce the electrical resistance between the bonding pad and the via plug 45. Accordingly, it is possible to reduce the number of manufacturing steps and the manufacturing cost of the semiconductor device.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device comprising:
a first chip including:
    a first substrate; and
    a transistor provided on the first substrate;
a second chip bonded to the first chip and including:
    a first insulating film provided above the transistor;
    a first plug provided in the first insulating film;
    a memory cell array provided above the transistor and including a plurality of word lines stacked in a first direction and a columnar portion that extends through the plurality of word lines in the first direction;
    a conductive layer provided above the memory cell array and connected to an upper end of the columnar portion;
a plurality of bonding metals provided on a bonding surface between the first chip and the second chip;
a second insulating film provided on the conductive layer;
a metal wiring provided on the second insulating film;
a first opening extending through the conductive layer and at least partially filled with an insulating material;
wherein the first opening includes a first part and a second part, the second part is below the first part, the first part has a first width in a second direction perpendicular to the first direction, the second part has a second width in the second direction and is smaller than the first width, and the first opening does not overlap with the memory cell array or the metal wiring in the first direction.

2. The semiconductor device according to claim 1, wherein the insulating material at least partially filling the first opening includes an air gap.

3. The semiconductor device according to claim 1, further comprising:
a third insulating film provided on the metal wiring, wherein at least one portion of the third insulating film is provided in a semiconductor layer.

4. The semiconductor device according to claim 3, wherein the at least one portion of the third insulating portion includes a second opening, and the bonding pad is exposed in the second opening.

5. The semiconductor device according to claim 1, wherein the first plug includes a plurality of plugs, and wherein the metal wiring includes one wiring provided on the plurality of plugs.

* * * * *